(12) United States Patent
Takano et al.

(10) Patent No.: US 8,045,335 B2
(45) Date of Patent: Oct. 25, 2011

(54) SEMICONDUCTOR DEVICE

(75) Inventors: Fumitomo Takano, Tochigi (JP); Shinya Watanabe, Tochigi (JP); Tsukasa Aiba, Tochigi (JP); Joji Nakashima, Tochigi (JP); Hiroshi Otsuka, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 432 days.

(21) Appl. No.: 12/376,541

(22) PCT Filed: Jul. 25, 2007

(86) PCT No.: PCT/JP2007/065035
§ 371 (c)(1),
(2), (4) Date: Mar. 12, 2009

(87) PCT Pub. No.: WO2008/018332
PCT Pub. Date: Feb. 14, 2008

(65) Prior Publication Data
US 2009/0257212 A1   Oct. 15, 2009

(30) Foreign Application Priority Data

Aug. 9, 2006  (JP) ................ P2006-217246
Aug. 9, 2006  (JP) ................ P2006-217279

(51) Int. Cl.
*H05K 1/11* (2006.01)
*H01R 9/00* (2006.01)
*H01L 21/70* (2006.01)

(52) U.S. Cl. ......... 361/784; 361/775; 361/792; 257/500

(58) Field of Classification Search .......... 174/260; 361/775, 783, 784, 790, 792, 794; 257/500–503, 257/499, 508, 676, 686, 690–692, 717, 723
See application file for complete search history.

(56) References Cited

U.S. PATENT DOCUMENTS

| | | | |
|---|---|---|---|
| 6,116,916 A * | 9/2000 | Kasai | 439/76.2 |
| 6,236,110 B1 * | 5/2001 | Muto et al. | 257/724 |
| 2001/0012212 A1 * | 8/2001 | Ikeda | 363/141 |
| 2002/0024129 A1 * | 2/2002 | Hirahara et al. | 257/691 |

(Continued)

FOREIGN PATENT DOCUMENTS

EP     1 411 551 A1     4/2004

(Continued)

OTHER PUBLICATIONS

Machine Translation of JP 2001308263 A: Okochi, Semiconduvtor Switching Module and Semiconductor; Publication Date: Nov. 2, 2001.*

*Primary Examiner* — William Mayo, III
*Assistant Examiner* — Sherman Ng
(74) *Attorney, Agent, or Firm* — Arent Fox LLP (57) ABSTRACT

A semiconductor device includes first and second assembled bodies (12A, 12B). The first assembled body is provided with a first semiconductor chip, a high voltage bus bar (21) connected to one surface of the first semiconductor chip, a first metal wiring board (24-1) connected to the other surface of the first semiconductor chip with a bonding wire, and a third metal wiring board (24-3) connected to the first metal wiring board. The second assembled body is provided with a second semiconductor chip, a low voltage bus bar (23) connected to one surface of the second semiconductor chip with a bonding wire, a second metal wiring board (24-2) connected to the other surface of the second semiconductor chip, and a fourth metal wiring board (24-4) connected by being returned from an end portion of the second metal wiring board and arranged in parallel to the second metal wiring board. The first assembled body and the second assembled body are arranged in a stacked structure wherein the assembled bodies are being separated. Inductance of a main circuit is reduced by the semiconductor module structure.

11 Claims, 7 Drawing Sheets

U.S. PATENT DOCUMENTS

| | | | |
|---|---|---|---|
| 2004/0089934 A1 * | 5/2004 | Shimoida et al. | 257/686 |
| 2004/0195649 A1 * | 10/2004 | Miura et al. | 257/529 |
| 2004/0256703 A1 * | 12/2004 | Tu et al. | 257/676 |
| 2005/0012206 A1 * | 1/2005 | Nakamura et al. | 257/717 |
| 2005/0263859 A1 * | 12/2005 | Kime et al. | 257/659 |
| 2006/0126316 A1 * | 6/2006 | Takagi et al. | 361/775 |

FOREIGN PATENT DOCUMENTS

| | | | |
|---|---|---|---|
| JP | 2001308263 A | * | 11/2001 |
| JP | 2002-026251 A | | 1/2002 |
| JP | 2004-140068 A | | 5/2004 |
| JP | 2006-310571 A | | 11/2006 |

* cited by examiner

SEMICONDUCTOR DEVICE

CROSS-REFERENCE TO RELATED APPLICATION

This application is a National Stage entry of International Application No. PCT/JP2007/065035, having an international filing date of Jul. 25, 2007; which claims priority to Japanese Application No.: 2006-217246, filed Aug. 9, 2006 and Japanese Application No.: 2006-217279, filed Aug. 9, 2006, the disclosure of each of which is hereby incorporated in its entirety by reference.

TECHNICAL FIELD

The present invention relates to a semiconductor device and, more particularly, to a semiconductor device that includes an IGBT module or the like used in a driving circuit for driving a driving motor of an electric vehicle.

BACKGROUND ART

Inverter devices are used to drive the driving motors of electric automobiles and other electric vehicles. These inverter devices include an electrical circuit in which switching elements are connected using a bridge-circuit configuration. Inverter devices turn the switching elements of the bridge circuit on and off as appropriate and execute the switching of current made to flow to the driving motor. Power transistors, IGBT, FET, and the like are widely used as the switching elements that constitute the bridge circuit. These inverter devices are usually configured in a modular structure in which a plurality of switching elements is housed in one package.

The operation of the driving motor of an electric vehicle is characterized in that a large current flows to the switching elements that constitute the bridge circuit, and a surge voltage is generated from the on/off operation. The length of the wiring that constitutes the electric current pathway is therefore made as short as possible when the plurality of switching elements is mounted inside one package in the inverter device, whereby resistance in the wiring is minimized, and the value of the inductance that is an electrical characteristic of alternating current is reduced.

A well-known example of a conventional semiconductor device having a modular structure similar to the aforedescribed inverter device is the semiconductor device described in Japanese Patent Application Laid-Open Publication No. 2002-26251. The semiconductor device described in Japanese Patent Application Laid-Open Publication No. 2002-26251 has three electric terminals: a high-voltage external electric terminal, a low-voltage external electric terminal, and an output external electric terminal. These three electric terminals all have a rectangular plate shape as the planar shape and are positioned in an overlaid state with gaps in between so as to be positioned in parallel. The output external electric terminal is positioned between the high-voltage external electric terminal and the low-voltage external electric terminal. The structure is such that semiconductor chips (switching elements or the like) are sandwiched between two adjacent electrical terminals from among the three electrical terminals. The high-voltage external electric terminal and the low-voltage external electric terminal are formed to extend towards the same end, and the output external electric terminal between these terminals is formed to extend towards the other end on the opposite side.

The connection between the semiconductor chips and the electrical terminals in the semiconductor device described in Japanese Laid-open Patent Publication No. 2002-26251 bridges a short distance, and therefore voltage drops resulting from internal wiring are reduced. This semiconductor device is also characterized in that the direction of current flowing to the high-voltage external electric terminal and the direction of current flowing to the low-voltage external electric terminal are opposite, and therefore the orientations of the magnetic fields generated by those currents are opposite, and inductance can be reduced.

The inverter device of a three-phase motor is provided with a high-side (high-voltage) semiconductor chip and a low-side (low-voltage) semiconductor chip for each of the U, V, and W phases and contains a total of six semiconductor chips. This inverter device is provided with a semiconductor module in which two semiconductor chips, high-side and low-side, are packaged for each phase. The high-side semiconductor chip and the low-side semiconductor chip of this semiconductor module will not short circuit during use in controlling a motor, and therefore current will not flow to the high-voltage electrical terminal and the low-voltage electrical terminal at the same time. In other words, the bridge circuit either contains an electric current pathway from the high-voltage electrical terminal through a semiconductor chip to the output electrical terminal, or an electric current pathway from the output electrical terminal through a semiconductor chip to the low-voltage electrical terminal. A problem is therefore presented in that reducing inductance is difficult when the configuration of the semiconductor device described in Japanese Patent Application Laid-Open Publication No. 2002-26251 is applied to controlling a motor using the inverter device of a three-phase motor.

The control substrate (the substrate on which the gate driver is mounted) for controlling the semiconductor chips must be positioned externally with respect to the module in the modular structures of the prior art. The length of control wiring to the control substrate from a control electrode leading from a gate electrode has therefore tended to increase. Problems have therefore been presented in that the wiring inductance increases, and anti-noise performance deteriorates. The control substrate, which is a separate unit from the module, also requires fastening members, a case, and the like, and problems have been presented in that the overall size of the semiconductor device increases.

The ability to reduce the inductance of the main circuit, improve the anti-noise properties of the driving signal, and make the modular structure smaller and more compact in the structure of a semiconductor module in which a plurality of semiconductor chips is mounted in one package has therefore been needed in the aforedescribed semiconductor device.

DISCLOSURE OF THE INVENTION

According to a first aspect of the present invention, there is provided a semiconductor device comprising a first assembly, a second assembly, and an output bus bar. The first assembly has a first semiconductor chip; a high-voltage bus bar that is bonded to one surface of the first semiconductor chip and that has a high-voltage terminal; a first metal wiring board that is connected to another surface of the first semiconductor chip using a bonding wire; and a third metal wiring board that is linked to the first metal wiring board, is separated by a prescribed interval from the bonding wire connected to the other surface of the first semiconductor chip, and is positioned parallel to the high-voltage bus bar. The second assembly has a second semiconductor chip; a low-voltage bus bar that is connected to one surface of the second semiconductor chip using a bonding wire and that has a low-voltage terminal; a second metal wiring board that is bonded to another surface of the second semiconductor chip; and a fourth metal wiring board that is linked by being bent from an end portion of the second metal wiring board, is separated by a prescribed interval from the bonding wire connected to the second semiconductor chip, and is positioned parallel to the second metal wiring board. The output bus bar has an output terminal extending from each end portion of the third metal wiring board and of the fourth metal wiring board. The first assembly and the second assembly are positioned in separated, layered structures, and the output bus bar is positioned between the layered structures.

When the power semiconductor elements of the semiconductor chips are IGBT elements (N-channel type), the first surface of the first semiconductor chip is a collector-side surface, the other surface is an emitter-side surface, the first surface of the second semiconductor chip is an emitter-side surface, and the other surface is a collector-side surface. The semiconductor devices below are the same in this respect.

According to the aforedescribed structure of a semiconductor-element module that is composed of the high-side and low-side semiconductor chips that constitute the bridge circuit of the inverter device, the high-side electric current pathway and the low-side electric current pathway are both configured so that current flows back and forth in opposite directions. The magnetic field generated around the high-voltage bus bar and the first metal wiring board is negated, and the magnetic field generated around the low-voltage bus bar and the second metal wiring board is also negated. The inductance of the main circuit in the structure of the semiconductor module is thereby reduced. The magnetic field generated around the high-voltage bonding wire and the third metal wiring board is also negated, and the magnetic field around the low-voltage bonding wire and the fourth metal wiring board is negated, as well. Additionally, by constructing the first and second assemblies, setting the assemblies apart by a prescribed distance, and arranging the assemblies as layered structures, the semiconductor module can be given a small and compact structure.

The first metal wiring board and the third metal wiring board are preferably formed as separate members; and the second metal wiring board and the fourth metal wiring board are preferably formed as separate members. According to this configuration, assembly is facilitated, and wire bonding is more easily performed.

A metal spacer is preferably provided between the first metal wiring board and the third metal wiring board and between the second metal wiring board and the fourth metal wiring board; and a gap between the third metal wiring board and the bonding wire as well as a gap between the fourth metal wiring board and the bonding wire are preferably configured to be adjustable.

Both of the first and second semiconductor chips are preferably provided with a power semiconductor element and a rectifier semiconductor element. When the semiconductor device is driven so that a greater portion of current flows to the power semiconductor elements relative to the rectifier semiconductor elements, the power semiconductor element of the first semiconductor chip is preferably positioned closer to the high-voltage terminal via the high-voltage bus bar, and the power semiconductor element of the second semiconductor chip is preferably positioned farther from the low-voltage terminal via the second metal wiring board. When the semiconductor device is driven so that a lesser portion of current flows to the power semiconductor elements relative to the rectifier semiconductor elements, the power semiconductor element of the first semiconductor chip is preferably positioned farther from the high-voltage terminal via the high-voltage bus bar, and the power semiconductor element of the second semiconductor chip is preferably positioned closer to the low-voltage terminal via the second metal wiring board; and the bonding wires connected to the power semiconductor elements are made longer than the bonding wires connected to the rectifier semiconductor elements.

In a preferred aspect, the device comprises a first control substrate that is positioned parallel to the third metal wiring board and that controls the first semiconductor chip; and a second control substrate that is positioned parallel to the third metal wiring board and that controls the second semiconductor chip.

According to a second aspect of the present invention, there is provided a semiconductor device comprising a first assembly, a second assembly, and an output bus bar. The first assembly is provided with a first semiconductor chip; a high-voltage bus bar that is bonded to one surface of the first semiconductor chip and that has a high-voltage terminal; and a first metal wiring board that is bonded to another surface of the first semiconductor chip. The second assembly is provided with a second semiconductor chip; a low-voltage bus bar that is bonded to one surface of the second semiconductor chip and that has a low-voltage terminal; and a second metal wiring board that is bonded to another surface of the second semiconductor chip. The output bus bar has an output terminal extending from each end portion of the first metal wiring board and of the second metal wiring board. The first assembly and the second assembly are positioned in separated, layered structures, and the output bus bar is positioned between the layered structures.

According to the aforedescribed structure of a semiconductor-element module that is composed of the high-side and low-side semiconductor chips that constitute the bridge circuit of the inverter device, the high-side electric current pathway and the low-side electric current pathway are both configured so that current flows back and forth in opposite directions. The magnetic field generated around the high-voltage bus bar and the first metal wiring board is negated, and the magnetic field generated around the low-voltage bus bar and the second metal wiring board is also negated. The inductance of the main circuit in the structure of the semiconductor module is thereby reduced. Additionally, by constructing the first and second assemblies, setting the assemblies apart by a prescribed distance, and arranging the assemblies as layered structures, the semiconductor module can be given a small and compact structure.

A length of an electric current pathway from the high-voltage terminal through the first semiconductor chip to the output terminal, and a length of an electric current pathway from the low-voltage terminal through the second semiconductor chip to the output terminal are preferably substantially equal. The electrical characteristics of the high-side semiconductor chip and the electrical characteristics of the low-side semiconductor chip can be made equal in this configuration.

In a preferred aspect, both of the first and second semiconductor chips are preferably provided with a power semiconductor element and a rectifier semiconductor element; when the semiconductor device is driven so that a greater portion of current flows to the power semiconductor elements relative to the rectifier semiconductor elements, the power semiconductor element of the first semiconductor chip is preferably positioned farther from the high-voltage terminal via the high-voltage bus bar, and the power semiconductor element of the second semiconductor chip is preferably positioned farther from the low-voltage terminal via the second metal wiring board; and, when the semiconductor device is driven so that a lesser portion of current flows to the power semiconductor elements relative to the rectifier semiconductor elements, the power semiconductor element of the first semiconductor chip is preferably positioned closer to the high-voltage terminal via the high-voltage bus bar, and the power semiconductor element of the second semiconductor chip is preferably positioned closer to the low-voltage terminal via the second metal wiring board.

The semiconductor device preferably comprises a first control substrate that is positioned parallel to the first metal wiring board and that controls the first semiconductor chip; and a second control substrate that is positioned parallel to the low-voltage bus bar and that controls the second semiconductor chip.

First and second magnetic resistance elements may be mounted in opposing positions on both the first and second control substrates. The first and second assemblies may also be constructed, separated by a prescribed distance, and arranged as layered structures. The semiconductor module can thereby be given a small and compact structure. A part of the output bus bar is extended between the first magnetic resistance element and the second magnetic resistance element.

A region of the output bus bar from a bonding portion of the first and second metal wiring boards to the magnetic resistance elements is disposed perpendicularly with respect to the surface on the outside of the control substrates.

In the semiconductor-element module that is composed of the high-side and low-side semiconductor chips that constitute the bridge circuit of the inverter device according to the present invention, the wiring pathway portion from the high-voltage terminal to the high-side semiconductor chip and the wiring pathway portion from that semiconductor chip to the output terminal are positioned in parallel and are configured so that the respective currents flow back and forth in opposite directions. The inductance of the high-voltage bus bar and other circuit portions can therefore be reduced. In the same semiconductor-element module, the wiring pathway portion from the output terminal to the low-side semiconductor chip and the wiring pathway portion from that semiconductor chip to the low-voltage terminal are positioned in parallel and are configured so that the respective currents flow back and forth in opposite directions. The inductance of the low-voltage bus bar and other circuit portions can therefore be reduced. Since the inductance can be reduced in the main circuit of the semiconductor-element module as described above, the switching loss and the surge voltage occurring during switching operations in the inverter device can be reduced.

According to the present invention, the semiconductor-element module is formed from the high-voltage first assembly and the low-voltage second assembly, and the first and second assemblies are formed over three dimensions in separated layered structures, and can therefore be made small and compact. The space provided by the first and second assemblies is used to position the control substrates so that the substrates will be provided within the semiconductor-element module. The control wiring leading to the control substrates can therefore be made extremely short, wiring inductance can be minimized, and anti-noise performance can be improved. Fastening members, cases, and the like for the control substrates are also unnecessary, and the entire semiconductor device can be made smaller.

BEST MODE FOR CARRYING OUT THE INVENTION

Certain preferred embodiments of the present invention will be described below with reference to the accompanying drawings.

Figure 1:
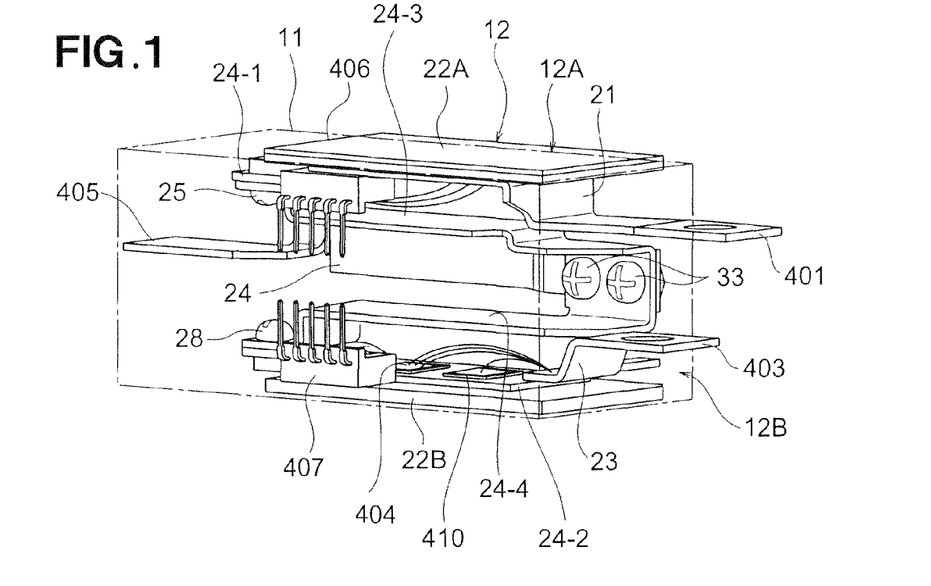
FIG. 1 shows the exterior of a semiconductor device according to a first embodiment of the present invention and, in particular, an external appearance of the modular structure of an IGBT module.
Figure 2:
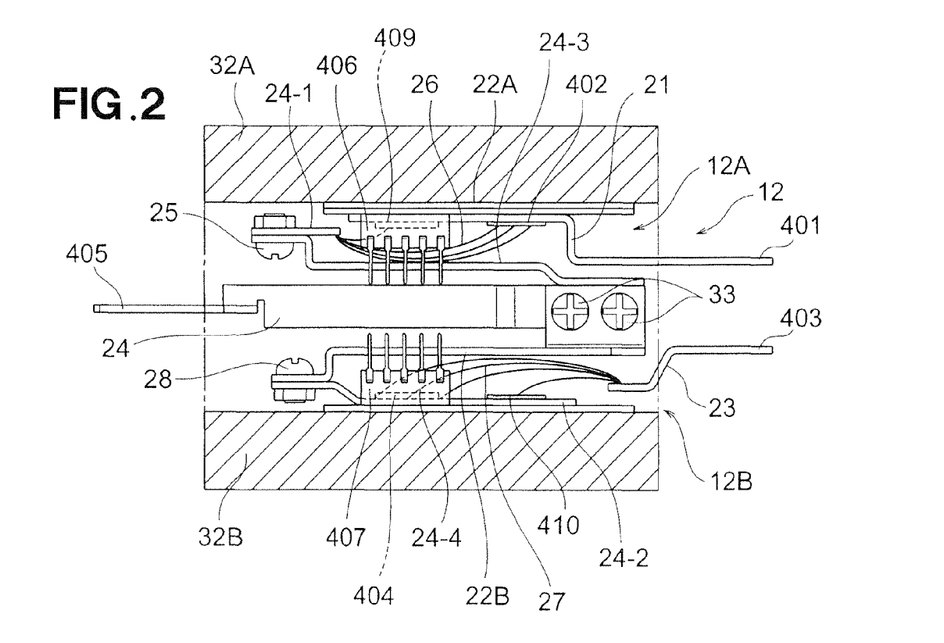
FIG. 2 is a view of the interior of the device of FIG. 1 as seen from a left side.
Figure 3:
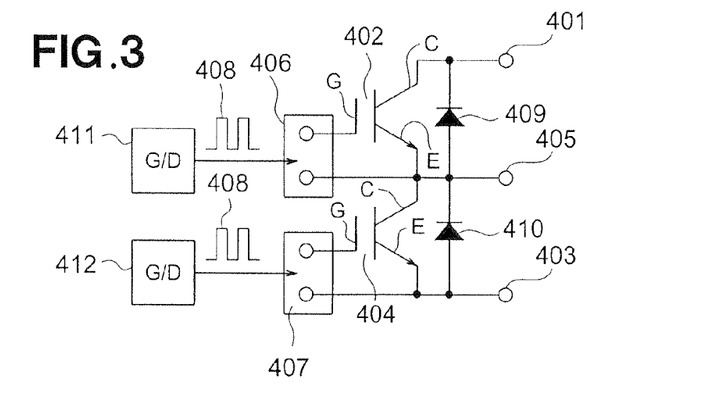
FIG. 3 is a circuit diagram of the electrical circuit of the IGBT module shown in FIG. 1.
Figure 4:
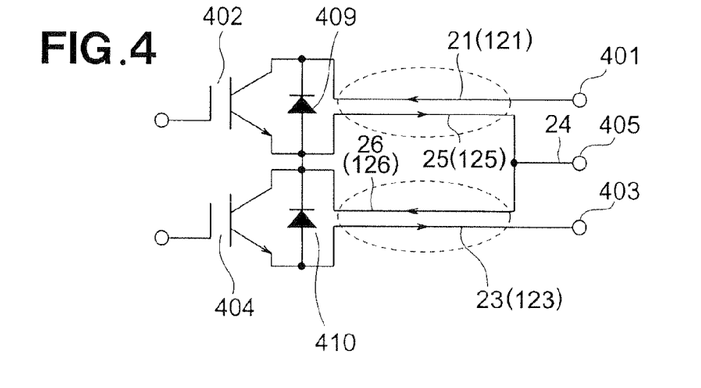
FIG. 4 is a circuit diagram schematically showing a characteristic relationship of wirings of the IGBT module of FIG. 1.

A semiconductor device according to the first embodiment of the present invention will be described with reference to FIGS. 1 through 4. FIG. 1 shows the exterior of the semiconductor device and shows the modular structure of an IGBT module. FIG. 2 is a side view from the left side of FIG. 1. FIG. 3 is a circuit-configuration diagram of the electrical circuit of the IGBT module shown in FIG. 1, and FIG. 4 shows the characteristic relationships of the wirings of the IGBT module.

The semiconductor device according to the present embodiment is a power semiconductor device, and is typically an inverter device for driving a three-phase motor that drives an electric vehicle. The IGBT module shown in FIG. 1 displays the main portions of the inverter device. The configuration of the electrical circuit of the IGBT module will be described first with reference to FIG. 3.

FIG. 3 shows the electrical circuit portions of a single phase (one phase from among the U, V, or W phases) of the bridge circuit of the inverter device. The electrical circuit shown in FIG. 3 includes a high-side IGBT element 402 positioned near a high-voltage terminal 401 and a low-side IGBT element 404 positioned near a low-voltage terminal 403. The semiconductor elements used in the semiconductor device according to the present embodiment are not limited to IGBT elements, and any power semiconductor element may be used. The bridge circuit of the inverter device is configured using six power semiconductor elements, but one module is formed by a pair of higher and lower power semiconductor elements.

The collector (C) of the IGBT element 402 is connected to the high-voltage terminal 401. The emitter (E) of the IGBT element 402 is connected to the collector (C) of the IGBT element 404, and this connection point is connected to an output terminal 405. The emitter (E) of the IGBT element 404 is connected to the low-voltage terminal 403.

Signal connectors 406, 407 are connected between the gates (G) and the emitters (E) of the two IGBT elements 402, 404. A driving-control rectangular pulse signal 408 for turning the IGBT elements 402, 404 on and off at an appropriate timing is input between the input terminals of the signal connectors 406, 407 from corresponding gate drivers (G/D) 411, 412. Rectifying diode elements 409, 410 are connected between the respective emitters (E) and collectors (C) of the two IGBT elements 402, 404.

The physical structure of the IGBT module having the aforedescribed electrical-circuit configuration will be described next with reference to FIGS. 1 and 2.

A block 11 shown by the alternatingly dotted line in FIG. 1 designates the external shape of the package that forms an IGBT module 12. The block 11 is substantially molded from resin. The portions designated by solid lines in FIG. 1 are the physical structure portions of the wiring board. The same notation is applied to elements that are substantially identical to the elements of the electrical circuit described using FIG. 4.

The IGBT module 12 is composed of a first assembly 12A and a second assembly 12B. The first assembly 12A contains a first metal wiring board 24-1; a third metal wiring board 24-3; and a high-voltage bus bar 21 that has the high-voltage terminal 401. The second assembly 12B contains a second metal wiring board 24-2; a fourth metal wiring board 24-4; and a low-voltage bus bar 23 that has the low-voltage terminal 403. In FIGS. 1 and 2, the first assembly 12A is positioned at the top, and the second assembly 12B is positioned at the bottom. The first assembly 12A and the second assembly 12B are configured in separated, layered structures. The first assembly 12A is positioned upside-down facing the second assembly 12B. The IGBT module 12 can be made small and compact by using such a layered three-dimensional structure.

The output bus bar 24 is placed in an intermediate position between the first assembly 12A and the second assembly 12B that have layered structures. Heat sinks 32A, 32B are provided on the back-surface portion (upper portion) of the first assembly 12A and on the back-surface portion (lower portion) of the second assembly 12B, respectively.

In FIG. 1, the portion designated by "401" is the aforedescribed high-voltage terminal, the portion designated by "403" is the aforedescribed low-voltage terminal, and the portion designated by "405" is the aforedescribed output terminal. "406" and "407" are the respective aforedescribed signal connectors. The "402" and "404" portions are the aforedescribed IGBT elements, and the "409" and "410" portions are the aforedescribed diode elements.

In FIGS. 1 and 2, the IGBT elements 402, 404 have an upright structure. The emitters and gates are formed on the surfaces on one side, and the collectors are formed on the surfaces on the other side. In the IGBT element 402 in FIG. 2, the lower surface is the first surface (the emitter and the gate), and the upper surface is the other surface (the collector). In the IGBT element 404 in FIG. 2, the upper surface is the first surface (the emitter and the gate), and the lower surface is the other surface (the collector). The anodes of the diode elements 409, 410 are formed on the first surfaces as defined above, and the cathodes thereof are formed on the other, opposite surfaces.

The high-voltage terminal 401 constitutes an end portion of the high-voltage bus bar 21 and is the external end portion of the high-voltage bus bar 21 extending rightwards to the exterior of the block 11 in FIGS. 1 and 2. The high-voltage bus bar 21 is a wiring member that overall has a rectangular plate shape. The high-voltage bus bar is a wiring member that is positioned towards the high-voltage terminal 401. As shown in FIGS. 1 and 2, the high-voltage bus bar 21 is formed in a flat plate shape for a prescribed distance beyond the high-voltage terminal 401 and is bent upwards from the middle. The left-half portion of the high-voltage bus bar in FIG. 2 is also formed in a flat plate shape. As shown in FIG. 1, a hole is formed located in the high-voltage terminal 401 of the high-voltage bus bar 21, and a left-half portion is fixed onto an insulating layer 22A. The insulating layer 22A is, e.g., an epoxy or insulating oxide film.

The low-voltage terminal 403 constitutes an end portion of the low-voltage bus bar 23 and is the external end portion of the low-voltage bus bar 23 extending rightwards to the exterior of the block 11 in FIGS. 1 and 2. The low-voltage bus bar 23 is also a wiring member that overall has a rectangular plate shape. The low-voltage bus bar is a wiring member that is positioned towards the low-voltage terminal 403. As shown in FIGS. 1 and 2, the low-voltage bus bar 23 is formed in a flat plate shape for a prescribed distance beyond the low-voltage terminal 403, is bent slightly downwards from the middle, and is fixed onto an insulating layer 22B. As shown in FIG. 1, a hole is formed located in the low-voltage terminal 403 of the low-voltage bus bar 23.

The output terminal 405 constitutes an end portion of the output bus bar 24 and is the external end portion of the output bus bar 24 extending leftwards to the exterior of the block 11 in FIGS. 1 and 2. The output bus bar 24 overall has a substantially elongated shape. The rightward end portion of the output bus bar 24 in FIGS. 1 and 2 is joined via a machine screw 33 to the bonding portion at the rightward ends of the third metal wiring board 24-3 and the fourth metal wiring board 24-4, which are described below.

As shown in FIGS. 1 and 2, the IGBT module 12 has the first metal wiring board 24-1, the second metal wiring board 24-2, the third metal wiring board 24-3, and the fourth metal wiring board 24-4 as wiring members. These first through fourth metal wiring boards are wiring elements that are connected to the aforedescribed output bus bar 24. The right-end portion of the output bus bar 24 is connected to the third metal wiring board 24-3 and the fourth metal wiring board 24-4, as described above.

The plate-shaped high-voltage terminal 401 of the high-voltage bus bar 21 and the plate-shaped low-voltage terminal 403 of the low-voltage bus bar 23 in the description above are placed next to each other so as to be on the same side of the IGBT module 12.

The output terminal 405 is positioned so as to be located in an intermediate position on the electric current pathway between the high-voltage terminal 401 and the low-voltage terminal 403. The length of the electric current pathway from the high-voltage terminal 401 through the high-side IGBT element 402 to the output terminal 405 and the length of the electric current pathway from the output terminal 405 through the low-side IGBT element 404 to the low-voltage terminal 403 are thereby made substantially equal. The high-side and low-side electrical characteristics are thereby made substantially equal, which is advantageous in terms of improving the output characteristics of the motor.

The plate shapes of the bus bars of the afore-described high-voltage bus bar 21, low-voltage bus bar 23, and output bus bar 24 have a width of, e.g., 20 mm, and a thickness of, e.g., 0.5 mm.

The electrical connectivity relationships of the IGBT elements 402, 404 and the diode elements 409, 410 will be described next. These connectivity relationships are constructed using wiring from the high-voltage bus bar 21, the low-voltage bus bar 23, the output bus bar 24, and the first through fourth metal wiring boards 24-1, 24-2, 24-3, 24-4.

The high-voltage (high-side) IGBT element 402 and the diode element 409 are attached on top of the high-voltage bus bar 21. The respective lower surfaces (at the top in FIG. 2) of the IGBT element 402 and the diode element 409, i.e., the surface on the collector side of the IGBT element 402 and the surface on the cathode side of the diode element 409, are soldered or otherwise bonded to the high-voltage bus bar 21. The diode element 409 is positioned in a location far from the high-voltage terminal 401, and the IGBT element 402 is positioned in a location close to the high-voltage terminal 401. The high-voltage bus bar 21 is a wiring member that is connected to the high-voltage terminal 401. The cathode of the diode element 409 and the collector of the IGBT element 402 are both electrically connected to the high-voltage bus bar 21.

The third metal wiring board 24-3 is positioned with the necessary spacing on the lower side of the aforedescribed diode element 409 and high-side IGBT element 402. The third metal wiring board 24-3 is substantially plated-shaped, and one end thereof is connected to the output bus bar 24. The first metal wiring board 24-1 is joined to the other end of the third metal wiring board 24-3 by a screw fastener 25. The joining portion formed using the screw fastener 25 may also be joined using another means, e.g., ultrasonic bonding, soldering, or crimping. The upper surfaces of the aforedescribed diode element 409 and IGBT element 402, i.e., the anode of the diode element 409 and the emitter and gate of the IGBT element 402, may all be connected to the first metal wiring board 24-1 by a bonding wire 26.

The low-voltage (low-side) IGBT element 404 and the diode element 410 are attached on top of the second metal wiring board 24-2 fixed on top of the insulating layer 22B, as shown in FIG. 2. The insulating layer 22B is, e.g., an epoxy or insulating oxide film. The respective lower surfaces (at the bottom in FIG. 2) of the IGBT element 404 and the diode element 410, i.e., the surface on the collector side of the IGBT element 404 and the surface on the cathode side of the diode element 410, are soldered or otherwise bonded to the second metal wiring board 24-2. The low-voltage bus bar 23 is a wiring member that is connected to the low-voltage terminal 403. The low-voltage bus bar 23 is connected to the anode on the upper surface of the diode element 410 and to the emitter and gate on the upper surface of the IGBT element 404 by a bonding wire 27. The diode element 410 is positioned in a location close to the low-voltage terminal 403, and the IGBT element 404 is positioned in a location far from the low-voltage terminal 403.

The second metal wiring board 24-2 is electrically connected to the cathode on the lower surface of the diode element 410 and to the gate and collector of the IGBT element 404. One end of the second metal wiring board 24-2 is joined to the fourth metal wiring board 24-4 by a screw fastener 28. The joining portion formed using the screw fastener 28 may also be joined using another means, e.g., ultrasonic bonding, soldering, or crimping.

The positional relationship between the high-side IGBT element 402 and the high-voltage terminal 401 of the diode element 409, and the positional relationship between the low-side IGBT element 404 and the low-voltage terminal 403 of the diode element 410 described above are relationships of proximity and distance opposite the respective terminals.

In this case, when the semiconductor device is driven so that a greater portion of current flows to the IGBT elements relative to the diode elements (when in power-running mode), the IGBT element of one semiconductor chip is positioned closer to the high-voltage terminal via the high-voltage bus bar, and the IGBT element of the other semiconductor chip is positioned farther from the low-voltage terminal via the second metal wiring board. On the other hand, when the semiconductor device is driven so that a lesser portion of current flows to the IGBT elements relative to the diode elements (when in regeneration mode), the IGBT element of one semiconductor chip is positioned farther from the high-voltage terminal via the high-voltage bus bar, and the IGBT element of the other semiconductor chip is positioned closer to the low-voltage terminal via the second metal wiring board.

The heat sink 32A is provided above the insulating layer 22A, i.e., above the first assembly 12A of the IGBT module 12, and the heat sink 32B is provided below the insulating layer 22B, i.e., below the second assembly 12B of the IGBT module 12, as shown in FIG. 2. A three-dimensional arrangement is employed in the IGBT module 12, which is molded from a resin, whereby the heat sinks 32A, 32B can be provided to two surfaces, and heat dissipation performance can be enhanced.

In the IGBT module 12 having the aforedescribed structure, the diode element 409 and the IGBT element 402 towards the high-voltage terminal 401 form the high-voltage (high-side) semiconductor chip, and the diode element 410 and the IGBT element 404 towards the low-voltage terminal 403 form the low-voltage (low-side) semiconductor chip. The high-voltage semiconductor chip is included in the first assembly 12A. The low-voltage semiconductor chip is included in the second assembly 12B.

In the aforedescribed structure, the first metal wiring board 24-1 and the third metal wiring board 24-3, as well as the low-voltage bus bar 23 and the high-voltage bus bar 21, which are positioned parallel to the semiconductor chips, all have a parallel positional relationship, and the distances therebetween are set to be as small as possible. The bus-bar structure of the high-voltage arm and the bus-bar structure of the low-voltage arm have a top-bottom relationship that is reversed relative to the semiconductor chips and have a symmetric positional relationship. The circuit inductance, circuit resistance, and other electrical properties are therefore the same for both the high-voltage arm and the low-voltage arm.

The third metal wiring board 24-3 in the description above is separated by a prescribed interval from the bonding wire 26 and is the metal wiring board positioned parallel to the high-voltage bus bar 21. The fourth metal wiring board 24-4 is bent back and linked from the end portion of the second metal wiring board 24-2, is separated by a prescribed interval from the bonding wire 27, and is the metal wiring board positioned parallel to the second metal wiring board 24-2.

Metal spacers having the desired thickness can be provided between the first metal wiring board 24-1 and the third metal wiring board 24-3 and between the second metal wiring board 24-2 and the fourth metal wiring board 24-4 in the aforedescribed structure. According to this structure, the gap between the third metal wiring board 24-3 and the bonding wire 26 and the gap between the fourth metal wiring board 24-4 and the bonding wire 27 can be appropriately adjusted.

FIG. 4 shows a wiring pathway for the high-voltage bus bar 21, the low-voltage bus bar 23, the output bus bar 24, and the first through fourth metal wiring boards 24-1 through 24-4. The wiring is laid so that the direction of the current flowing in the wiring pathway is reversed in the high-voltage semiconductor chip (the IGBT element 402 and the diode element 409) and in the low-voltage semiconductor chip (the IGBT element 404 and the diode element 410), as is made clear from FIG. 4.

The inductance of the main circuit is significantly reduced due to the aforedescribed configuration of the wiring board pathway of the IGBT module 12, and an effect of non-inductance is generated due to mutual inductance.

An overview of an example method for manufacturing the aforedescribed IGBT module 12 will be given next.

First, a reflow furnace is used to die bond the high-voltage semiconductor chip (the IGBT element 402 and the diode element 409) to the high-voltage bus bar 21, and the low-voltage semiconductor chip (the IGBT element 404 and the diode element 410) to the second metal wiring board 24-2.

Next, the high-voltage bus bar 21 is set onto the upper surface of the heat sink 32A via the insulating layer 22A. The second metal wiring board 24-2 is set onto the upper surface of the heat sink 32B via the insulating layer 22B.

Next, a wire-bonding jig is set onto the upper surface of the heat sink 32A, and the high-voltage bus bar 21 and the third metal wiring board 24-3 are positioned on the wire-bonding jig.

The second metal wiring board 24-2 and the low-voltage bus bar 23 are set on the upper surface of the heat sink 32B in the same manner.

Next, the signal connector 406 is joined to the upper surface of the heat sink 32A, and the signal connector 407 is joined to the upper surface of the heat sink 32B.

Next, the respective main power wires and signal wires of the first and second assemblies 12A, 12B are wire bonded.

Next, the first metal wiring board 24-1 and the third metal wiring board 24-3 are bonded, and the second metal wiring board 24-2 and the fourth metal wiring board 24-4 are bonded.

Next, the first assembly and the second assembly are positioned in a three-dimensionally layered configuration, and the output terminal is bonded to the first and second assemblies.

Next, the wire-bonding jig is removed, and, finally, resin molding (for the block 11) is performed.

Figure 5:
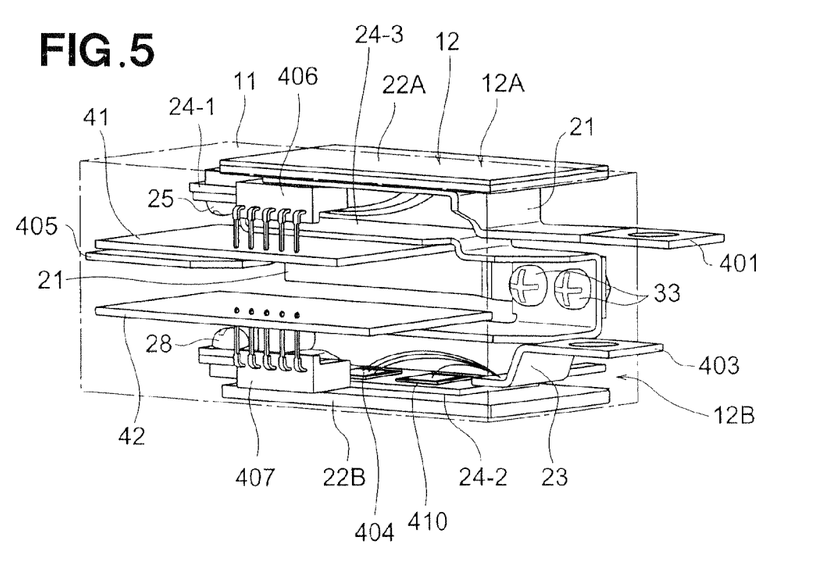
FIG. 5 shows the exterior of a semiconductor device according to a second embodiment of the present invention and, in particular, an external appearance of the modular structure of an IGBT module.
Figure 6:
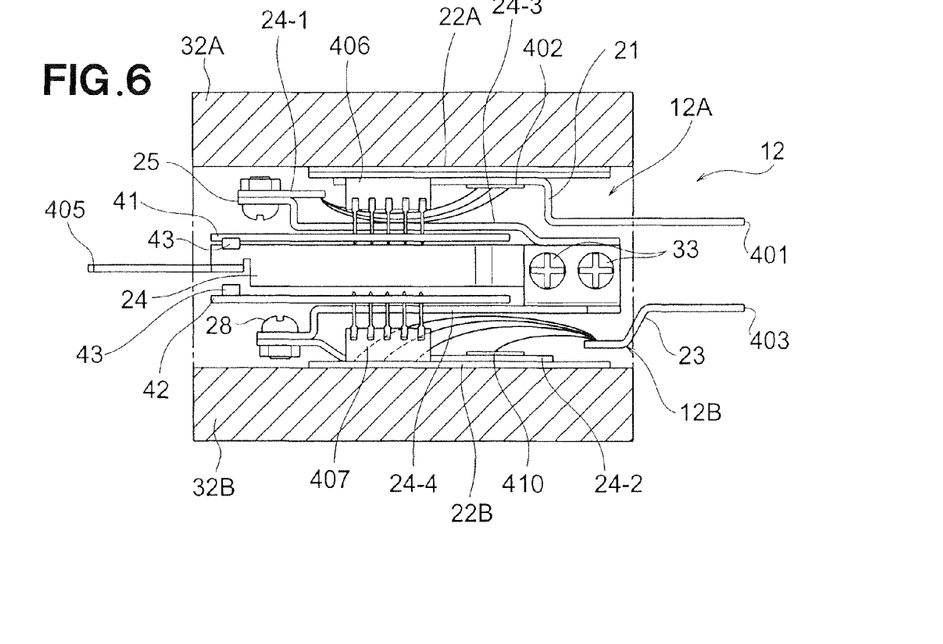
FIG. 6 is a view similar to FIG. 2 but showing the semiconductor device according to the second embodiment.

A semiconductor device according to a second embodiment of the present invention will be described next with reference to FIGS. 5 and 6. FIG. 5 corresponds to FIG. 1, and FIG. 6 corresponds to FIG. 2. The same notation will be applied to those elements in FIGS. 5 and 6 that are substantially identical to elements described in the first embodiment, and descriptions will be omitted.

A first control substrate 41 and a second control substrate 42 are affixed to the first assembly 12A and the second assembly 12B, respectively, of the IGBT module 12 in the semiconductor device of the present embodiment. The aforedescribed gate drivers (G/D) 411, 412 are installed in the first and second control substrates 41, 42, respectively, and current sensors 43 are affixed thereto. The first control substrate 41 is electrically connected to the signal connector 406, and the second control substrate 42 is electrically connected to the signal connector 407. The first control substrate 41 is positioned parallel to the high-voltage bus bar 21 and the like, and the second control substrate 42 is positioned parallel to the low-voltage bus bar 23 and the like. The first and second control substrates 41, 42 therefore also have a parallel positional relationship. The rest of the structure is identical to the structure described in the first embodiment.

The two aforedescribed current sensors 43 are magnetic resistance elements for detecting the value of the current flowing to the high-voltage bus bar 21, the low-voltage bus bar 23, or the like. The two current sensors 43 are mounted in opposing positions in the vertical direction on the control substrates 41, 32. The current sensors 43 are mounted within the IGBT module 12, whereby the length of the signal wiring in the semiconductor device can be shortened, and anti-noise properties can be improved. Attachment members can also be omitted, in contrast to cases where external current sensors (a magnetic core and a Hall element) are affixed; therefore a more compact structure can be obtained.

A part of the output terminal 405 connected to the output bus bar 24 is extended between the two current sensors 43.

According to the semiconductor device of the second embodiment, the aforedescribed control substrates 41, 42 that include the gate drivers 411; 412 are positioned using the space between the first assembly 12A and the second assembly 12B. The semiconductor device can therefore be made smaller and more compact.

In the output bus bar 24 that connects to the output terminal, the region from the bonding portion of the third metal wiring board 24-3 and the fourth metal wiring board 24-4 to the location corresponding to the position of the current sensors 43 is disposed in a perpendicular positional relationship relative to the surface that includes the control substrates 41, 42 on the lateral exterior side of the first and second control substrates 41, 42. According to this configuration, the portions of the output bus bar 24 other than those that correspond to the current sensors 43 formed as magnetic resistance elements are positioned outside the control substrates 41, 42; therefore, the effect of output noise on the control substrates 41, 42 can be limited.

In the method for manufacturing the IGBT module 12 provided with the first and second control substrates 41, 42, the control substrates 41, 42 and the pins of the signal connectors 406, 407 are connected at the stage just before the step for layering and positioning.

Figure 7:
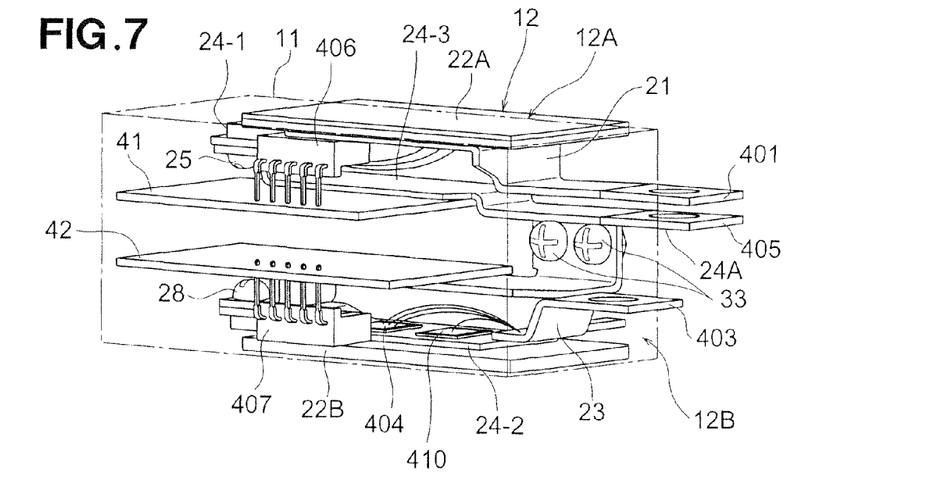
FIG. 7 shows the exterior of a semiconductor device according to a third embodiment of the present invention and, in particular, an external appearance of the modular structure of an IGBT module.
Figure 8:
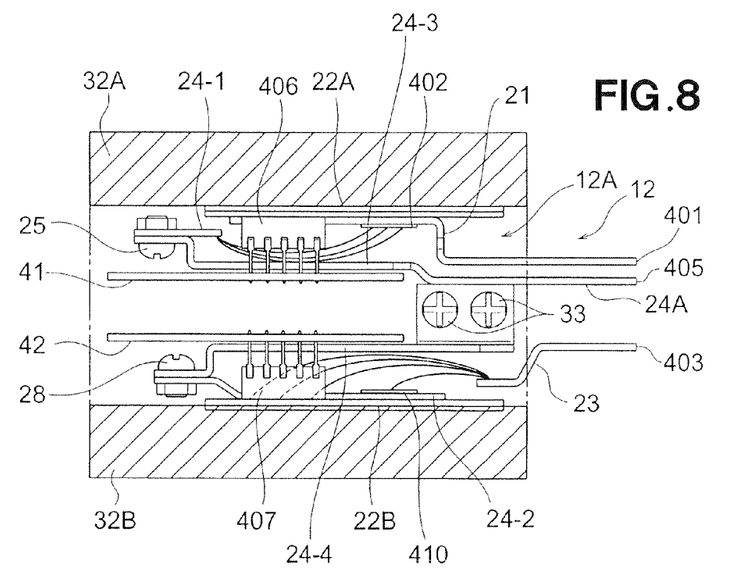
FIG. 8 is a view similar to FIG. 2 but showing the semiconductor device according to the third embodiment.

A semiconductor device according to a third embodiment of the present invention will be described next with reference to FIGS. 7 and 8. The third embodiment is a modification of the second embodiment. FIG. 7 corresponds to FIG. 5, and FIG. 8 corresponds to FIG. 6. The same notation will be applied to those elements in FIGS. 7 and 8 that are substantially identical to elements described in the second embodiment, and descriptions will be omitted.

The first control substrate 41 and the second control substrate 42 are provided to the first assembly 12A and the second assembly 12B, respectively, of the IGBT module 12 in the semiconductor device of the present embodiment, as in the second embodiment. An output bus bar 24A of the present embodiment is formed in a shape extending from a portion of the third metal wiring board 24-3 to the right side of FIG. 8. The output terminal 405 is provided to the tip of this output bus bar. The output terminal 405 is positioned on the same side so as to be parallel to the high-voltage terminal 401 and the low-voltage terminal 403. The aforedescribed current sensors 43 are omitted. The rest of the structure is the same as the structure described in the first and second embodiments.

According to the semiconductor device of the third embodiment, the high-voltage bus bar 21, the low-voltage bus bar 23, and the output bus bar 24A are provided on the same side in the IGBT module 12. The semiconductor device is made compact, and the output bus bar 24A is positioned in a location removed from the first and second control substrates 41, 42. The effect of output noise on the control substrates 41, 42 can therefore be limited.

In the description of these embodiments, an N-channel IGBT element was used as the power semiconductor element employed in the semiconductor device. In this instance, the power semiconductor elements in the semiconductor chips are IGBT elements (N-channel type). In the semiconductor chip of the first assembly 12A, a first surface is the collector-side surface, and the other surface is the emitter-side surface. In the semiconductor chip of the second assembly 12B, a first surface is the emitter-side surface, and the other surface is the collector-side surface.

When any other power semiconductor elements other than IGBT elements are used as the power semiconductor elements, the first side and the other side are the surfaces that correspond functionally to the respective surfaces of the aforedescribed IGBT elements. When using, e.g., an N-channel MOS-FET, the collector of the IGBT element corresponds to the "drain," and the emitter of the IGBT element corresponds to the "source."

Figure 9:
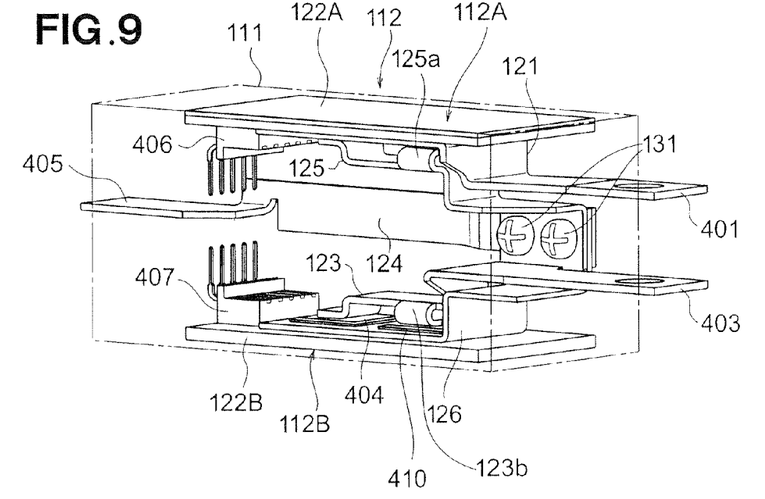
FIG. 9 shows the exterior of a semiconductor device according to a fourth embodiment of the present invention and, in particular, an external appearance of the modular structure of an IGBT module.
Figure 10:
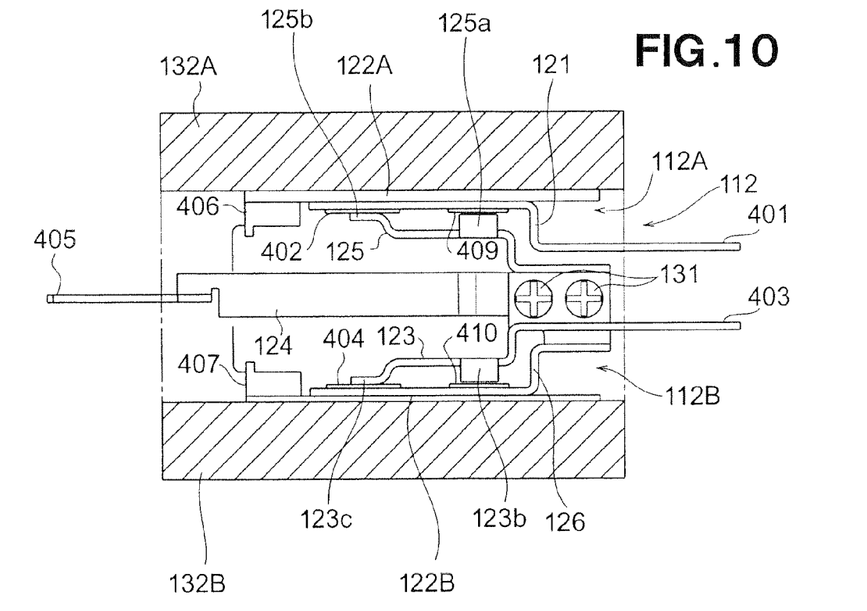
FIG. 10 is a view of the interior of the device of FIG. 9 as seen from a left side.

A semiconductor device according to a fourth embodiment of the present invention will be described with reference to FIGS. 9 and 10. FIG. 9 shows the exterior of the semiconductor device. FIG. 10 is a side view from the left side of FIG. 9.

A block 111 shown by the alternatingly dotted line in FIGS. 9 and 10 designates the external shape of the package that forms an IGBT module 112. The block 111 is substantially molded from resin. The portions designated by solid lines in FIG. 9 are the physical structure portions of the wiring board. The same notation is applied to elements that are substantially identical to the elements of the electrical circuit described using FIG. 3.

The IGBT module 112 is composed of a first assembly 112A that includes a high-voltage bus bar 121, a first metal wiring board 125, and the like; and a second assembly 112B that includes a low-voltage bus bar 123, a second metal wiring board 126, and the like. In FIGS. 9 and 10, the first assembly 112A is positioned at the top, and the second assembly 112B is positioned at the bottom. The first assembly 112A is positioned upside-down facing the second assembly 112B. The first assembly 112A and the second assembly 112B are configured in separated, layered structures. The IGBT module 112 can be made small and compact by using such a layered three-dimensional structure.

An output bus bar 124 is placed in an intermediate position between the first assembly 112A and the second assembly 112B that have layered structures. Heat sinks 132A, 132B are provided on the back-surface portion (upper portion) of the first assembly 112A and on the back-surface portion (lower portion) of the second assembly 112B, respectively.

In FIGS. 9 and 10, the portion designated by "401" is the aforedescribed high-voltage terminal, the portion designated by "403" is the aforedescribed low-voltage terminal, and the portion designated by "405" is the aforedescribed output terminal. "406" and "407" are the respective aforedescribed signal connectors. The "402" and "404" portions are the aforedescribed IGBT elements, and the "409" and "410" portions are the aforedescribed diode elements.

In FIGS. 9 and 10, the IGBT elements 402, 404 have an upright structure, as described in the first embodiment. The emitters and gates are formed on the surfaces on one side, and the collectors are formed on the surfaces on the other side. In the IGBT element 402 in FIG. 10, the lower surface is the first surface (the emitter and the gate), and the upper surface is the other surface (the collector). In the IGBT element 404 in FIG. 10, the upper surface is the first surface (the emitter and the gate), and the lower surface is the other surface (the collector). The anodes of the diode elements 409, 410 are formed on the first surfaces as defined above, and the cathodes thereof are formed on the other, opposite surfaces.

The high-voltage terminal 401 constitutes an end portion of a high-voltage bus bar 121 and is the external end portion of the high-voltage bus bar 121 extending leftwards to the exterior of the block 111. The high-voltage bus bar 121 is a wiring member that overall has a rectangular plate shape. The high-voltage bus bar is a wiring member that is positioned towards the high-voltage terminal 401. As shown in FIGS. 9 and 10, the high-voltage bus bar 121 is formed in a flat plate shape for a prescribed distance beyond the high-voltage terminal 401 and is bent from the middle towards an insulating layer 122A. The left-half portion of the high-voltage bus bar in FIG. 10 is also formed in a flat plate shape. A hole is formed located in the high-voltage terminal 401 of the high-voltage bus bar 121, and a left-half portion is fixed onto an insulating layer 122A. The insulating layer 122A is, e.g., an epoxy or insulating oxide film. The heat sink 132A is fixed to the insulating layer 122A.

The low-voltage terminal 403 constitutes an end portion of a low-voltage bus bar 123 and is the external end portion of the low-voltage bus bar 123 extending rightwards to the exterior of the block 111. The low-voltage bus bar 123 is also a wiring member that overall has a rectangular plate shape. The low-voltage bus bar is a wiring member that is positioned towards the low-voltage terminal 403. As shown in FIGS. 9 and 10, the low-voltage bus bar 123 is formed in a flat plate shape for a prescribed distance beyond the low-voltage terminal 403, is bent slightly from the middle towards an insulating layer 122B, and the left-half portion thereof in FIG. 10 is substantially flat-plate shaped. As shown in FIG. 10 and the like, a hole is formed located in the low-voltage terminal 403 of the low-voltage bus bar 123.

The aforedescribed plate-shaped high-voltage bus bar 121 and low-voltage bus bar 123 are separated and positioned substantially parallel and facing each other, with the former above and the latter below.

The output terminal 405 constitutes an end portion of an output bus bar 124 and is the external end portion of the output bus bar 124 extending leftwards to the exterior of the block 111 in FIGS. 9 and 10. The output bus bar 124 is positioned in a location between the output bus bar 121 and the low-voltage bus bar 123 and overall has a substantially rectangular thin plate shape. The output bus bar 124 is provided as an output end extending from the end portions on the right side in FIG. 10 of the first metal wiring board 125 and the second metal wiring board 126.

The plate-shaped high-voltage terminal 401 of the high-voltage bus bar 121 and the plate-shaped low-voltage terminal 403 of the low-voltage bus bar 123 in the description above are placed next to each other so as to be positioned located on the same side of an IGBT module 112. The plate-shaped output terminal 405 of the output bus bar 124 is positioned in a location on the left side of the IGBT module 112 in FIGS. 9 and 10.

The output terminal 405 is positioned so as to be located in an intermediate position on the electric current pathway between the high-voltage terminal 401 and the low-voltage terminal 403.

According to the aforedescribed configuration, the length of the electric current pathway from the high-voltage terminal 401 through the high-side IGBT element 402 to the output terminal 405 and the length of the electric current pathway from the output terminal 405 through the low-side IGBT element 404 to the low-voltage terminal 403 are made substantially equal. The high-side and low-side electrical characteristics are thereby made substantially equal, which is advantageous in terms of improving the output characteristics of the motor.

The plate shapes of the bus bars of the afore-described high-voltage bus bar 121 and low-voltage bus bar 123 have a width of, e.g., 20 mm, and a thickness of, e.g., 0.5 mm.

The connectivity relationships of the IGBT elements 402, 404 and the diode elements 409, 410 will be described next.

The high-voltage (high-side) IGBT element 402 and the diode element 409 are attached on the high-voltage bus bar 121. In FIGS. 9 and 10, the IGBT element 402 and the diode element 409 attached to the lower surface of the high-voltage bus bar 121. The respective bonding surfaces of the IGBT element 402 and the diode element 409, i.e., the surface on the collector side of the IGBT element 402 and the surface on the cathode side of the diode element 409, are soldered or otherwise bonded to the high-voltage bus bar 121. The diode element 409 is positioned in a location close to the high-voltage terminal 401, and the IGBT element 402 is positioned in a location far from the high-voltage terminal 401. The high-voltage bus bar 121 is a wiring member that is connected to the high-voltage terminal 401. The cathode of the diode element 409 and the collector of the IGBT element 402 are both electrically connected to the high-voltage bus bar 121.

The first metal wiring board 125 is positioned below the diode element 409 and the IGBT element 402 in FIGS. 9 and 10. The first metal wiring board 125 is substantially plate-shaped and is connected by soldering to both the anode of the diode element 409 and the emitter and gate of the IGBT element 402. The first metal wiring board 125 and the diode element 409 are electrically connected by lateral strip portions 125a that are bent on both sides, and the first metal wiring board 125 and the IGBT element 402 are electrically connected by an end-portion strip 125b that is bent upwards. An end portion of the first metal wiring board 125 is connected to the output bus bar 124. The first metal wiring board 125 and the output bus bar 124 may be connected by a machine screw or screw fastener 131 or may be bonded by soldering. Ultrasonic bonding or crimping may also be used at this fixation point.

The low-voltage (low-side) IGBT element 404 and the diode element 410 are attached on top of the second metal wiring board 126 fixed on top of the insulating layer 122B and are positioned in a location below the low-voltage bus bar 123. The insulating layer 122B is, e.g., an epoxy or insulating oxide film. The respective lower surfaces of the IGBT element 404 and the diode element 410, i.e., the surface on the collector side of the IGBT element 404 and the surface on the cathode side of the diode element 410, are soldered or otherwise bonded to the second metal wiring board 126. The diode element 410 is positioned in a location close to the low-voltage terminal 403, and the IGBT element 404 is positioned in a location far from the low-voltage terminal 403. The low-voltage bus bar 123 is a wiring member that is connected to the low-voltage terminal 403. The low-voltage bus bar 123 is connected to the anode on the upper surface of the diode element 410 and to the emitter and gate on the upper surface of the IGBT element 404 by soldering or the like. The low-voltage bus bar 123 and the diode element 410 are electrically connected by lateral strip portions 123b that are bent downwards on both sides, and the low-voltage bus bar 123 and the IGBT element 404 are electrically connected by an end-portion strip 123c that is bent downwards. The second metal wiring board 126 is substantially plate-shaped and is electrically connected by soldering to both the anode of the diode element 410 and the collector of the IGBT element 404. An end portion of the second metal wiring board 126 is bent and connected to the output bus bar 124. The second metal wiring board 126 and the output bus bar 124 may be connected by a machine screw or screw fastener 131 or may be bonded by soldering. Ultrasonic bonding or crimping may also be used at this fixation point, as above.

According to the aforedescribed structure, the output bus bar 124 is extendedly provided from the first metal wiring board 125 and the second metal wiring board 126.

The positional relationship between the high-side IGBT element 402 and the high-voltage terminal 401 of the diode element 409, and the positional relationship between the low-side IGBT element 404 and the low-voltage terminal 403 of the diode element 410 are relationships of proximity and distance identical to the respective terminals.

In this case, when the semiconductor device is driven so that a greater portion of current flows to the IGBT elements relative to the diode elements (when in power-running mode), the IGBT element of one semiconductor chip is positioned farther from the high-voltage terminal via the high-voltage bus bar, and the IGBT element of the other semiconductor chip is positioned farther from the low-voltage terminal via the second metal wiring board. On the other hand, when the semiconductor device is driven so that a lesser portion of current flows to the IGBT elements relative to the diode elements (when in regeneration mode), the IGBT element of one semiconductor chip is positioned closer to the high-voltage terminal via the high-voltage bus bar, and the IGBT element of the other semiconductor chip is positioned closer to the low-voltage terminal via the second metal wiring board.

The heat sink 132A is provided above the insulating layer 122A, i.e., above the first assembly 112A of the IGBT module 112, and the heat sink 132B is provided below the insulating layer 122B, i.e., below the second assembly 112B of the IGBT module 112, as shown in FIG. 10. A three-dimensional arrangement is employed in the IGBT module 112, which is molded from a resin, whereby the heat sinks 132A, 132B can be provided to two surfaces, and heat dissipation performance can be enhanced.

In the IGBT module 112 having the aforedescribed structure, the diode element 409 and the IGBT element 402 towards the high-voltage terminal 401 form the high-voltage (high-side) semiconductor chip and are included in the first assembly 12A. The diode element 410 and the IGBT element 404 towards the low-voltage terminal 403 form the low-voltage (low-side) semiconductor chip and are included in the second assembly 12B.

In the aforedescribed structure, the first metal wiring board 125 and the second metal wiring board 126, as well as the low-voltage bus bar 123 and the high-voltage bus bar 121, which are positioned parallel to the semiconductor chips, all have a parallel positional relationship, and the distances therebetween are set to be as small as possible. The circuit inductance, circuit resistance, and other electrical properties are therefore the same for both the high-voltage arm and the low-voltage arm on the basis of the bus-bar structure of the high-voltage arm and the bus-bar structure of the low-voltage arm.

FIG. 4 shows a wiring pathway for the high-voltage bus bar 121, the low-voltage bus bar 123, the output bus bar 124, the first metal wiring board 125, and the second metal wiring board 126. The wiring is laid so that the direction of the current flowing in the wiring pathway is reversed in the high-voltage semiconductor chip (the IGBT element 402 and the diode element 409) and in the low-voltage semiconductor chip (the IGBT element 404 and the diode element 410), as in FIG. 4.

The inductance of the main circuit is significantly reduced due to the aforedescribed configuration of the wiring pathway of the IGBT module 112, and an effect of non-inductance is generated due to mutual inductance.

An overview of an example method for manufacturing the aforedescribed IGBT module 112 will be given next. The output bus bar 124 is a two-part type in this example. The output bus bar 124 and the output terminal 405 are therefore formed as extended portions of the first metal wiring board 125 and the second metal wiring board 126.

(1) Setting Step

First, the high-voltage bus bar 121 and the lower surface (the upper surface in FIG. 10) of the high-voltage semiconductor chip (the IGBT element 402 and the diode element 409) are set using solder paste, and, in addition, the first metal wiring board 125 and the upper surface (the lower surface in FIG. 10) of that semiconductor chip are set using solder paste (the high-voltage first assembly 112A is set).

Next, the second metal wiring board 126 and the lower surface (the lower surface in FIG. 10) of the low-voltage semiconductor chip (the IGBT element 404 and the diode element 410) are set using solder paste, and, in addition, the low-voltage bus bar 123 and the upper surface (the upper surface in FIG. 10) of that semiconductor chip are set using solder paste (the low-voltage second assembly 112B is set).

Next, the first metal wiring board 125 and the second metal wiring board 126 are set using solder paste. The first metal wiring board 125 and the second metal wiring board 126 are bonded by soldering in this example.

(2) Bonding Step

The set material, which was set as described above, is placed in a reflow furnace, where soldering is performed. The elements of the set materials are bonded.

(3) Assembly and Finishing Step

Next, the first assembly 112A is set onto the upper surface (the lower surface in FIG. 10) of the heat sink 132A via the insulating layer 122A. The second assembly 112B is set onto the upper surface (the upper surface in FIG. 10) of the heat sink 132B via the insulating layer 122B.

Next, the signal connector 406 is joined to the upper surface of the heat sink 132A, and the signal connector 407 is joined to the upper surface of the heat sink 132B.

Next, the necessary signal wires are wire-bonded between the signal connectors 406, 407.

(4) Step for Layering and Positioning

The first assembly 112A and the second assembly 112B are positioned in a three-dimensionally layered configuration.

Next, the first metal wiring board 125, the low-voltage bus bar 123, and the output bus bar 124 are bonded.

(5) Molding Step

Finally, resin molding (for the block 111) is performed.

Figure 11:
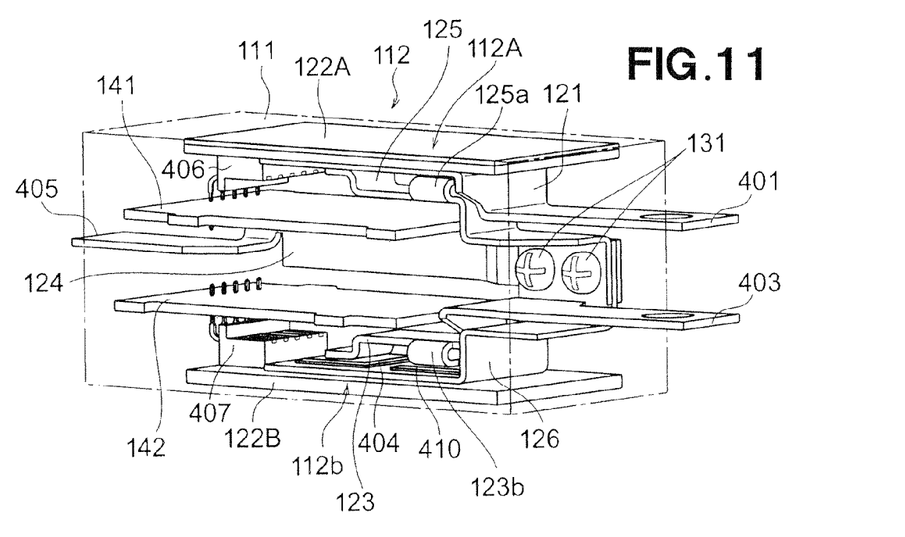
FIG. 11 shows the exterior of a semiconductor device according to a fifth embodiment of the present invention and, in particular, an external appearance of the modular structure of an IGBT module.
Figure 12:
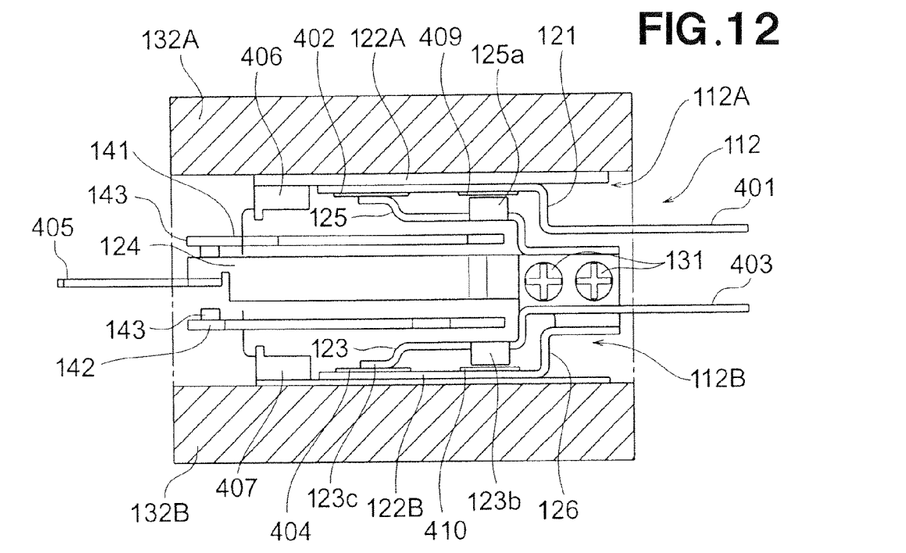
FIG. 12 is a view similar to FIG. 10 but showing the semiconductor device according to the fifth embodiment.

A semiconductor device according to a fifth embodiment of the present invention will be described next with reference to FIGS. 11 and 12. FIG. 11 corresponds to FIG. 9, and FIG. 12 corresponds to FIG. 10. The same notation will be applied to those elements in FIGS. 11 and 12 that are substantially identical to elements described in the fourth embodiment, and descriptions will be omitted.

A first control substrate 141 and a second control substrate 142 are affixed to the first assembly 112A and the second assembly 112B, respectively, of the IGBT module 112 in the semiconductor device of the present embodiment. The aforedescribed gate drivers (G/D) 411, 412 are installed in the first and second control substrates 141, 142, respectively, and current sensors 143 are affixed thereto. The first control substrate 141 is electrically connected to the signal connector 406, and the second control substrate 142 is electrically connected to the signal connector 407. The first control substrate 141 is positioned parallel to the high-voltage bus bar 121, the first metal wiring board 125, and the like, and the second control substrate 142 is positioned parallel to the low-voltage bus bar 123, the second metal wiring board 126, and the like. The first and second control substrates 141, 142 therefore also have a parallel positional relationship. The rest of the structure is identical to the structure described in the fourth embodiment.

The two aforedescribed current sensors 143 are magnetic resistance elements for detecting the value of the current flowing to the high-voltage bus bar 121, the low-voltage bus bar 123, or the like. The two current sensors 143 are mounted in opposing positions in the vertical direction on the control substrates 141, 142. The current sensors 143 are mounted within the IGBT module 112, whereby the length of the signal wiring in the semiconductor device can be shortened, and anti-noise properties can be improved. Attachment members can also be omitted, in contrast to cases where external electrical current sensors (a magnetic core and a Hall element) are affixed; therefore a more compact structure can be obtained.

A part of the output terminal 405 connected to the output bus bar 124 is extended between the two current sensors 143.

According to the semiconductor device of the fifth embodiment, the aforedescribed control substrates 141, 142 that include the gate drivers 411, 412 are positioned using the space between the first assembly 112A and the second assembly 112B. The semiconductor device can therefore be made smaller and more compact.

In the output bus bar 124 that connects to the output terminal, the region from the bonding portion of the first metal wiring board 125 and the second metal wiring board 126 to the location corresponding to the position of the current sensors 143 is disposed in a perpendicular positional relationship relative to the surface that includes the control substrates 141, 142 on the lateral exterior side of the first and second control substrates 141, 142. According to this configuration, the portions of the output bus bar 124 other than those that correspond to the current sensors 143 formed as magnetic resistance elements are positioned outside the control substrates 141, 142; therefore, the effect of output noise on the control substrates 141, 142 can be limited.

In the method for manufacturing the IGBT module 112 provided with the first and second control substrates 141, 412, the control substrates 141, 142 and the pins of the signal connectors 406, 407 are connected after wire-bonding the necessary signal wires between the signal connectors 406, 407.

Figure 13:
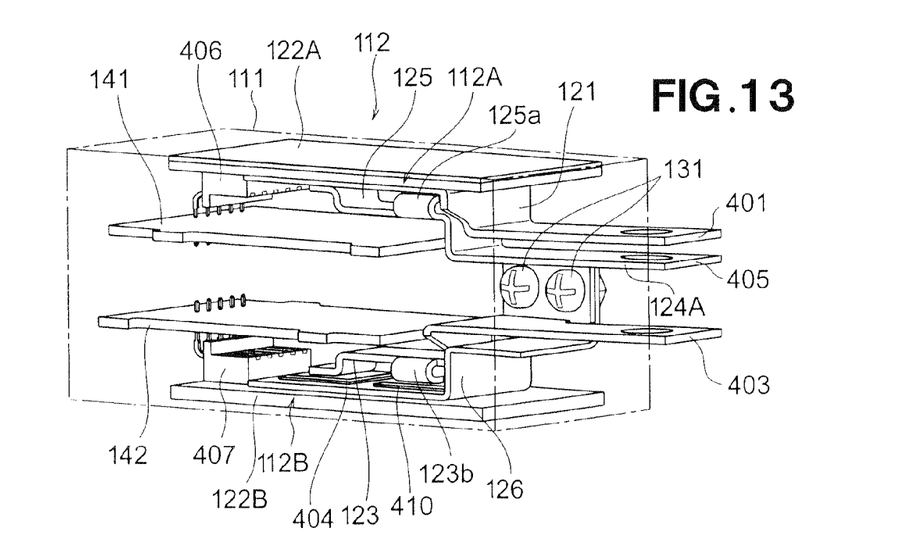
FIG. 13 shows the exterior of a semiconductor device according to a sixth embodiment of the present invention and, in particular, an external appearance of the modular structure of an IGBT module.
Figure 14:
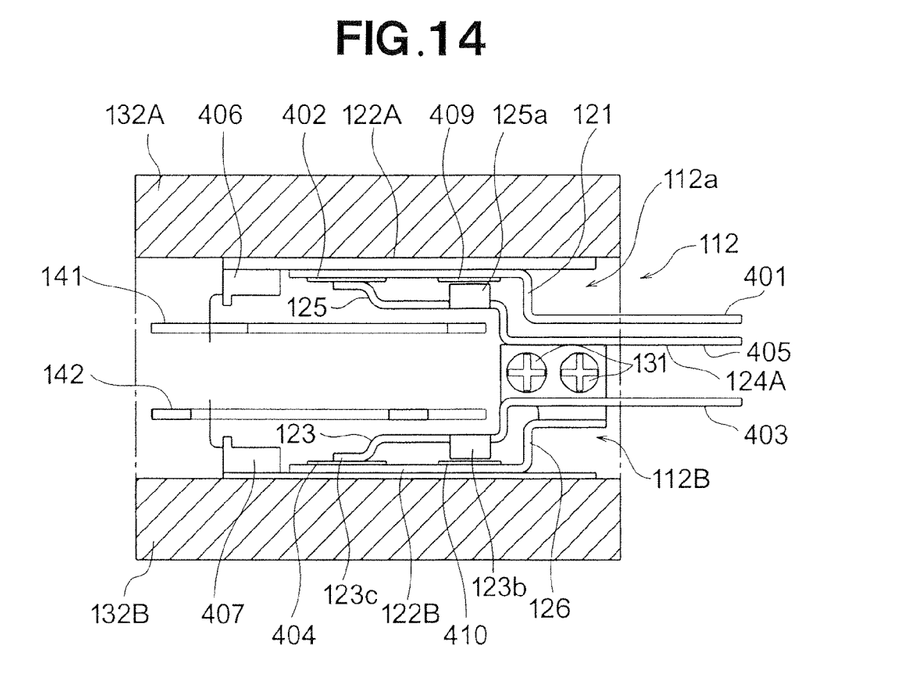
FIG. 14 is a view similar to FIG. 10 but showing the semiconductor device according to the sixth embodiment.

A semiconductor device according to a sixth embodiment of the present invention will be described next with reference to FIGS. 13 and 14. The sixth embodiment is a modification of the fifth embodiment. FIG. 13 corresponds to FIG. 11, and FIG. 14 corresponds to FIG. 12. The same notation will be applied to those elements in FIGS. 13 and 14 that are substantially identical to elements described in the fifth embodiment, and descriptions will be omitted.

The first control substrate 141 and the second control substrate 142 are provided to the first assembly 112A and the second assembly 112B, respectively, of the IGBT module 112 in the semiconductor device of the present embodiment, as in the fifth embodiment. An output bus bar 124A of the present embodiment is formed in a shape extending from a portion of the first metal wiring board 125 to the right side of FIG. 14. The output terminal 405 is provided to the tip of this output bus bar. The output terminal 405 is positioned on the same side so as to be parallel to the high-voltage terminal 401 and the low-voltage terminal 403. The aforedescribed current sensors 143 are omitted. The rest of the structure is the same as the structure described in the fourth and fifth embodiments.

In the semiconductor device according to the sixth embodiment, the high-voltage bus bar 121, the low-voltage bus bar 123, and the output bus bar 124A are provided on the same side in the IGBT module 112. The semiconductor device is made compact, and the output bus bar 124A is positioned in a location removed from the first and second control substrates 141, 142. The effect of output noise on the control substrates 141, 142 can therefore be limited.

In the description of the fourth through sixth embodiments, an N-channel IGBT element was used as the power semiconductor element employed in the semiconductor device. In this instance, the power semiconductor elements in the semiconductor chips are IGBT elements (N-channel type). In the semiconductor chip of the first assembly 112A, a first surface is the collector-side surface, and the other surface is the emitter-side surface. In the semiconductor chip of the second assembly 112B, a first surface is the emitter-side surface, and the other surface is the collector-side surface.

When any other power semiconductor elements other than IGBT elements are used as the power semiconductor elements, the first side and the other side are the surfaces that correspond functionally to the respective surfaces of the aforedescribed IGBT elements, as in the first embodiment. When using, e.g., an N-channel MOS-FET, the collector of the IGBT element corresponds to the "drain," and the emitter of the IGBT element corresponds to the "source."

The configuration, shape, size, and arrangement described in the examples above provides an outline that allows the present invention to be understood and implemented, and numbers and compositions (materials) of configurations are merely examples. Therefore, the present invention is not limited to the examples described above, and various modifications can be implemented within a scope that does not depart from the technical concepts designated by the claims.

INDUSTRIAL APPLICABILITY

The present invention is particularly useful as a modular structure of a semiconductor-element of an inverter device for driving a motor that drives an electric vehicle.

The invention claimed is:

1. A semiconductor device comprising:
a first assembly including:
a first semiconductor chip,
a high-voltage bus bar that is bonded to one surface of the first semiconductor chip and that has a high-voltage terminal,
a first metal wiring board that is connected to another surface of the first semiconductor chip using a bonding wire, and
a third metal wiring board that is linked to the first metal wiring board, is separated by a prescribed interval from the bonding wire connected to the other surface of the first semiconductor chip, and is positioned parallel to the high-voltage bus bar;
a second assembly including:
a second semiconductor chip,
a low-voltage bus bar that is connected to one surface of the second semiconductor chip using a bonding wire and that has a low-voltage terminal,
a second metal wiring board that is bonded to another surface of the second semiconductor chip, and
a fourth metal wiring board that is linked by being bent from an end portion of the second metal wiring board, is separated by a prescribed interval from the bonding wire connected to the second semiconductor chip, and is positioned parallel to the second metal wiring board; and
an output bus bar having an output terminal extending from each end portion of the third metal wiring board and of the fourth metal wiring board,
wherein the first assembly and the second assembly are positioned in separated, layered structures, and the output bus bar is positioned between the layered structures.

2. The semiconductor device according to claim 1, wherein the first metal wiring board and the third metal wiring board are formed as separate members, and the second metal wiring board and the fourth metal wiring board are formed as separate members.

3. The semiconductor device according to claim 1 or 2, wherein a metal spacer is provided between the first metal wiring board and the third metal wiring board and between the second metal wiring board and the fourth metal wiring board, and a gap between the third metal wiring board and the bonding wire as well as a gap between the fourth metal wiring board and the bonding wire are configured to be adjustable.

4. The semiconductor device according to claim 1, wherein both of the first and second semiconductor chips have a power semiconductor element and a rectifier semiconductor element,
when the semiconductor device is driven so that a greater portion of current flows to the power semiconductor elements relative to the rectifier semiconductor elements, the power semiconductor element of the first semiconductor chip is positioned closer to the high-voltage terminal via the high-voltage bus bar, and the power semiconductor element of the second semiconductor chip is positioned farther from the low-voltage terminal via the second metal wiring board,
when the semiconductor device is driven so that a lesser portion of current flows to the power semiconductor elements relative to the rectifier semiconductor elements, the power semiconductor element of the first semiconductor chip is positioned farther from the high-voltage terminal via the high-voltage bus bar, and the power semiconductor element of the second semiconductor chip is positioned closer to the low-voltage terminal via the second metal wiring board, and
the bonding wires connected to the power semiconductor elements are made longer than the bonding wires connected to the rectifier semiconductor elements.

5. The semiconductor device according to claim 1, further comprising:
a first control substrate that is positioned parallel to the third metal wiring board and that controls the first semiconductor chip; and
a second control substrate that is positioned parallel to the third metal wiring board and that controls the second semiconductor chip.

6. A semiconductor device comprising:
- a first assembly having a first semiconductor chip, a high-voltage bus bar that is bonded to one surface of the first semiconductor chip and that has a high-voltage terminal, and a first metal wiring board that is bonded to another surface of the first semiconductor chip;
- a second assembly having a second semiconductor chip, a low-voltage bus bar that is bonded to one surface of the second semiconductor chip and that has a low-voltage terminal, and a second metal wiring board that is bonded to another surface of the second semiconductor chip; and
- an output bus bar having an output terminal extending from each end portion of the first metal wiring board and of the second metal wiring board,
- wherein the first assembly and the second assembly are positioned in separated, layered structures, and the output bus bar is positioned between the layered structures.

7. The semiconductor device according to claim 6, wherein a length of an electric current pathway from the high-voltage terminal through the first semiconductor chip to the output terminal, and a length of an electric current pathway from the low-voltage terminal through the second semiconductor chip to the output terminal are substantially equal.

8. The semiconductor device according to claim 6 or 7, wherein both of the first and second semiconductor chips are provided with a power semiconductor element and a rectifier semiconductor element,
- when the semiconductor device is driven so that a greater portion of current flows to the power semiconductor elements relative to the rectifier semiconductor elements, the power semiconductor element of the first semiconductor chip is positioned farther from the high-voltage terminal via the high-voltage bus bar, and the power semiconductor element of the second semiconductor chip is positioned farther from the low-voltage terminal via the second metal wiring board, and
- when the semiconductor device is driven so that a lesser portion of current flows to the power semiconductor elements relative to the rectifier semiconductor elements, the power semiconductor element of the first semiconductor chip is positioned closer to the high-voltage terminal via the high-voltage bus bar, and the power semiconductor element of the second semiconductor chip is positioned closer to the low-voltage terminal via the second metal wiring board.

9. The semiconductor device according to claim 6, further comprising:
- a first control substrate that is positioned parallel to the first metal wiring board and that controls the first semiconductor chip; and
- a second control substrate that is positioned parallel to the low-voltage bus bar and that controls the second semiconductor chip.

10. The semiconductor device according to claim 5 or 9, wherein first and second magnetic resistance elements are mounted in opposing positions on both the first and second control substrates, and a part of the output bus bar is extended between the first magnetic resistance element and the second magnetic resistance element.

11. The semiconductor device according to claim 10, wherein a region of the output bus bar from a bonding portion of the first and second metal wiring boards to the magnetic resistance elements is disposed perpendicularly with respect to a surface on the outside of the control substrates.

* * * * *